United States Patent
Kamei et al.

(10) Patent No.: US 9,388,508 B2
(45) Date of Patent: Jul. 12, 2016

(54) MANUFACTURING APPARATUS OF SIC SINGLE CRYSTAL, JIG FOR USE IN THE MANUFACTURING APPARATUS, AND METHOD FOR MANUFACTURING SIC SINGLE CRYSTAL

(75) Inventors: Kazuhito Kamei, Tokyo (JP); Kazuhiko Kusunoki, Tokyo (JP); Nobuyoshi Yashiro, Tokyo (JP); Nobuhiro Okada, Tokyo (JP); Motohisa Kado, Susono (JP); Hidemitsu Sakamoto, Susono (JP); Hironori Daikoku, Susono (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 420 days.

(21) Appl. No.: 13/997,766

(22) PCT Filed: Dec. 26, 2011

(86) PCT No.: PCT/JP2011/080107
§ 371 (c)(1),
(2), (4) Date: Jun. 25, 2013

(87) PCT Pub. No.: WO2012/090951
PCT Pub. Date: Jul. 5, 2012

(65) Prior Publication Data
US 2013/0305981 A1 Nov. 21, 2013

(30) Foreign Application Priority Data
Dec. 27, 2010 (JP) .................... 2010-289925

(51) Int. Cl.
C30B 11/04 (2006.01)
C30B 15/32 (2006.01)
C30B 19/06 (2006.01)
C30B 29/36 (2006.01)

(52) U.S. Cl.
CPC ................. *C30B 15/32* (2013.01); *C30B 19/06* (2013.01); *C30B 29/36* (2013.01); *Y10T 117/1032* (2015.01); *Y10T 117/1072* (2015.01)

(58) Field of Classification Search
CPC .......... C30B 11/02; C30B 11/04; C30B 29/36
See application file for complete search history.

(56) References Cited

U.S. PATENT DOCUMENTS

| 4,152,194 A * | 5/1979 | Frosch ..................... C30B 15/00 117/36 |
| 2007/0209573 A1 * | 9/2007 | Kusunoki .................. C30B 9/06 117/28 |

FOREIGN PATENT DOCUMENTS

| JP | 05-004895 | 1/1993 |
| JP | 2001-072490 | 3/2001 |
| JP | 2004-323247 | 11/2004 |

(Continued)

*Primary Examiner* — Robert M Kunemund
(74) *Attorney, Agent, or Firm* — Clark & Brody (57) ABSTRACT

A manufacturing apparatus of a SiC single crystal which can suppress the generation of a polycrystal is provided. A jig (41) and a crucible (6) are accommodated in a chamber (1). A SiC solution (8) is housed in the crucible (6). The jig (41) includes a seed shaft (411) and a cover member (412). The seed shaft (411) can move up and down, and a SiC seed crystal (9) is attached to the lower surface thereof. The cover member (412) is attached to the lower end portion of the seed shaft (411). The cover member (412) is a housing which has an opening at its lower end, wherein the lower end portion of the seed shaft (411) is disposed in the cover member (412).

12 Claims, 6 Drawing Sheets

(56) References Cited

FOREIGN PATENT DOCUMENTS

| | | |
|---|---|---|
| JP | 2006-131433 | 5/2006 |
| JP | 2006-232570 | 9/2006 |
| JP | 2006-321681 | 11/2006 |
| JP | 2007-126335 | 5/2007 |
| JP | 2008-100854 | 5/2008 |
| WO | 2007/094155 | 8/2007 |

* cited by examiner

MANUFACTURING APPARATUS OF SiC SINGLE CRYSTAL, JIG FOR USE IN THE MANUFACTURING APPARATUS, AND METHOD FOR MANUFACTURING SiC SINGLE CRYSTAL

TECHNICAL FIELD

The present invention relates to a manufacturing apparatus of a silicon carbide (SiC) single crystal, a jig used in the manufacturing apparatus, and a method for manufacturing a SiC single crystal, and more particularly to a manufacturing apparatus of a SiC single crystal by a solution growth method, a jig used in the manufacturing apparatus, and a method for manufacturing a SiC single crystal by using the jig.

BACKGROUND ART

Silicon carbide (SiC) is a thermally and chemically stable compound semiconductor. Compared with silicon (Si), SiC has an excellent band gap, break down voltage, electron saturation velocity, and thermal conductivity. Therefore, SiC is promising for application in technical fields such as power device materials with low operating loss, high-voltage resistant high-frequency device materials, environment-resistant devices used in high-temperature environments, and radiation-resistant devices. In these technical fields, a high quality SiC single crystal with few crystal defects is demanded.

Methods for manufacturing a SiC single crystal include a sublimation method and a solution growth method. A method for manufacturing a SiC single crystal by the sublimation method is disclosed in, for example, JP2001-72490A (Patent Document 1). Moreover, a method for manufacturing a SiC single crystal by the solution growth method is disclosed in, for example, JP2007-126335A (Patent Document 2).

Compared to the sublimation method, the solution growth method produces a single crystal with less crystal defects. In the solution growth method, a SiC single crystal which is attached to a lower end of a bar-shaped seed shaft is brought into contact with a SiC solution housed in a crucible. Next, the SiC seed crystal is pulled up while the seed shaft is rotated so that a SiC single crystal is grown on the SiC seed crystal. The SiC solution refers to a solution in which carbon (C) is dissolved in a solution of Si or Si alloy.

In the solution growth method, the temperature of the portion of the SiC solution in the periphery of the SiC seed crystal (hereafter, referred to as a SiC seed-crystal peripheral area) is kept lower than that of the other portion of SiC solution. This will cause a supersaturation of SiC in the SiC seed-crystal peripheral area, thereby accelerating the growth of the SiC single crystal.

However, when the SiC seed-crystal peripheral area is excessively cooled, a SiC polycrystal, instead of a SiC single crystal, is likely to be generated in the vicinity of the SiC seed crystal. The generated SiC polycrystal is moved to the SiC seed crystal by the flow of the solution. When a large amount of SiC polycrystal adheres to the SiC single crystal which has grown on the SiC seed crystal, the growth of the SiC single crystal may be hindered.

JP2004-323247A (Patent Document 3), JP2008-100854A (Patent Document 4), and JP2006-131433A (Patent Document 5) disclose methods for manufacturing a SiC single crystal for the purpose of suppressing the generation of SiC polycrystal.

In the manufacturing method disclosed in Patent Document 3, an insulating cover or a graphite cover is disposed above the solution surface to suppress the heat release from surface of the SiC solution.

In the manufacturing method disclosed in Patent Document 4, the SiC seed crystal attached to the lower end of a pull-up shaft is held at a position deviated from the axial centerline of the pull-up shaft. Then, at the time of manufacturing a single crystal, the pull-up shaft is rotated around the axial centerline. In this case, the SiC seed crystal circles around in the solution. The document describes that since this will cause the SiC seed crystal to be constantly in contact with an appropriately supersaturated solution, the generation of SiC polycrystal is suppressed.

In the manufacturing method disclosed in Patent Document 5, an insulating structure is disposed in a free space above the crucible to adjust an in-plane temperature difference in the free surface of the solution to be within 40° C.

DISCLOSURE OF THE INVENTION

However, in the manufacturing method of Patent Document 3, due to a wide gap between the surface of the SiC solution and the lower surface of the insulation cover and the graphite, heat may be released from the surface of the SiC solution to some degree. On that account, the temperature of the SiC seed-crystal peripheral area of the SiC solution may excessively be lowered so that a SiC polycrystal is generated in a large amount.

In the method disclosed in Patent Document 4, the temperature of the surface portion of the SiC solution cannot be appropriately maintained. On that account, the temperature of the SiC seed-crystal peripheral area may excessively be lowered so that a SiC polycrystal is generated in a large amount.

In the method disclosed in Patent Document 5, as in the Patent Document 3, a gap is wide between the surface of the SiC solution and the lower surface of the insulating structure. On that account, the temperature of the SIC seed-crystal peripheral area may excessively be lowered so that a SiC polycrystal is generated in a large amount.

It is an object of the present invention to provide an apparatus for manufacturing a SiC single crystal by a solution growth method, which can suppress the generation of SiC polycrystal.

The manufacturing apparatus of a SiC single crystal according to the present embodiment includes a chamber, a vertical seed shaft, and a cover member. The chamber accommodates a crucible for housing a SiC solution. The seed shaft extends in the up-and-down direction of the manufacturing apparatus, in which a SiC seed crystal can be attached to the lower end surface of the seed shaft. The cover member can be housed in the crucible and is a housing having an open lower end, in which the lower end portion of the seed shaft is disposed inside the cover member.

The manufacturing apparatus of a SiC single crystal according to the present embodiment suppresses an excessive decrease in temperature of the portion of the SiC solution in the periphery of the location where the SiC seed crystal contacts. Thereby, the generation of SiC polycrystal can be suppressed.

A jig for a SiC single crystal according to the present embodiment includes the above described seed shaft, and the cover member. Moreover, the method for manufacturing a SiC single crystal according to the present embodiment utilizes the above described manufacturing apparatus.

DESCRIPTION OF EMBODIMENTS

Hereafter, embodiments of the present invention will be described in detail with reference to the drawings. The same or corresponding components in the drawings will be given the same reference characters and description thereof will not be repeated.

First Embodiment

Configuration of Manufacturing Apparatus of SiC Single Crystal

Figure 1:
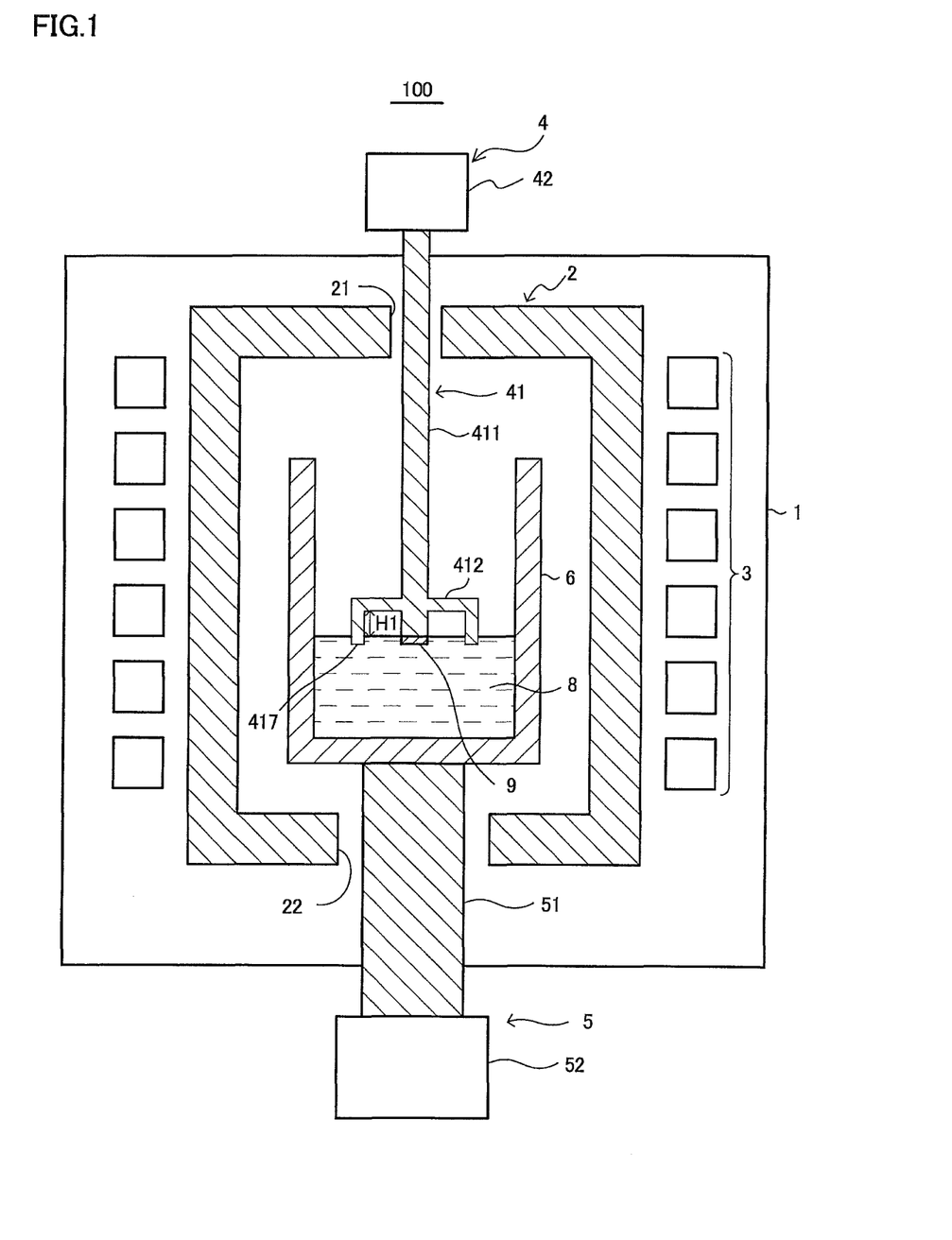
FIG. 1 is a schematic diagram of a manufacturing apparatus of a SiC single crystal according to an embodiment of the present invention.

FIG. 1 is a configuration diagram of a manufacturing apparatus of a SiC single crystal according to the present embodiment. Referring to FIG. 1, a manufacturing apparatus 100 includes a chamber 1, an insulating member 2, a heating unit 3, an up-and-down moving unit 4, and a rotation unit 5.

The chamber 1 is a housing and houses the insulating member 2, the heating unit 3, and a crucible 6. When a SiC single crystal is manufactured, the chamber 1 is water cooled.

The rotation unit 5 includes a rotating member 51 and a driving source 52. The rotating member 51 has a bar-like shape and extends in the up-and-down direction of the manufacturing apparatus 100. The crucible 6 is disposed at the upper end of the rotating member 51. The crucible 6 may be fixed to the upper end of the rotating member 51. The lower end portion of the rotating member 51 is connected with the driving source 52. When a SiC single crystal is manufactured, the rotation unit 5 rotates the crucible 6. To be specific, the driving source 52 rotates the rotating member 51. On that account, the crucible 6 attached to the rotating member 51 rotates around the axial centerline of the rotating member 51.

The crucible 6 is a housing which has an open upper end. The crucible 6 houses a SiC solution 8. The SiC solution 8, which is the starting material of SiC single crystal, contains silicon (Si) and carbon (C). As described below, the SiC solution 8 may further contain one or more kinds of metal elements other than Si and C.

The SiC solution 8 is produced by heating and melting the starting material of a SiC solution. The starting material may be a Si simple substance, or may contain Si and other metal elements. Examples of the metal element contained in the starting material of SiC solution include titan (Ti), manganese (Mn), chromium (Cr), cobalt (Co), vanadium (V), iron (Fe), and so on. Preferable elements to be contained in the starting material of the SiC solution are Ti and Mn, and a more preferable element is Ti.

The raw material of the crucible 6 is, for example, graphite. When the crucible 6 is made up of graphite, the crucible 6 itself serves as a carbon source for the SiC solution. The raw material of the crucible 6 may be other than graphite. For example, the crucible 6 may be made up of ceramics or a high-melting-point metal. When the crucible 6 cannot be used as a carbon source, the starting material of SiC solution will contain graphite. Moreover, when the crucible 6 is made up of a raw starting material other than graphite, a coating made of SiC may be formed on the inner surface of the crucible 6. The crucible 6 may have a cover not shown.

The up-and-down moving unit 4 includes a jig 41 and a driving source 42. The driving source 42 is disposed above the chamber 1. The jig 41 is bar-shaped and is disposed in coaxial with the rotating member 51. The lower end portion of the jig 41 is disposed inside the chamber 1. The upper end portion of the jig 41 is disposed above the chamber 1. That is, the jig 41 penetrates through the chamber 1.

The upper end portion of the jig 41 is connected to the driving source 42. The driving source 42 drives the jig 41 to move up and down. The driving source 42 further drives the jig 41 to rotate around the central axis of the jig 41. The lower end of the jig 41 is disposed in the crucible 6. A SiC seed crystal 9 is attached to the lower end of the jig 41.

A SiC seed crystal 9 is in a plate shape and made up of a SiC single crystal. When a SiC single crystal is manufactured by a solution growth method, the SiC single crystal is produced and grown on the surface of the SiC seed crystal 9. When a SiC single crystal having a crystal structure of 4H polymorphism is manufactured, the SiC seed crystal 9 is preferably a single crystal having a crystal structure of 4H polymorphism. More preferably, the surface of the SiC seed crystal (corresponding to the lower surface of the SiC seed crystal 9 in FIG. 1) is a (0001) plane or a plane inclined by an angle of not more than 8° from the (0001) plane. In this case, the SIC single crystal is likely to grow in a stable manner.

When a SiC single crystal is manufactured, the jig 41 is moved downward and, as shown in FIG. 1, the SiC seed crystal 9 is brought into contact with the SiC solution 8. At this moment, the SiC solution is kept at a crystal growth temperature. The crystal growth temperature depends on the composition of the SiC solution. A typical crystal growth temperature is 1600 to 2000° C.

The heating unit 3 is disposed around the crucible 6. In the present example, the heating unit 3 is a ring-shaped high-frequency coil and is disposed in coaxial with the jig 41 and the rotating member 51. The heating unit 3 inductively heats the crucible 6 and thereby melts the starting material housed in the crucible 6, producing a SiC solution 8. The heating unit 3 further maintains the SiC solution 8 at the crystal growth temperature.

The insulating member 2 is housing-shaped and has a side wall, an upper cover, and a lower cover. The side wall of the insulating member 2 is disposed between the heating unit 3 and the crucible 6. Further, the side wall of the insulating member 2 is disposed around the crucible 6. The upper cover of the insulating member 2 is disposed above the crucible 6. The upper cover has a through hole 21 for passing the jig 41 (seed shaft 411) therethrough. The lower cover of the insulating member 2 is disposed below the crucible 6. The lower cover has a through hole 22 for passing the rotating member 51 therethrough. In short, the insulating member 2 covers the entire crucible 6.

The insulating member 2 includes a well-known insulating material. The insulating material is a fibrous or non-fibrous molded insulating material. In order to form a SiC single crystal having a diameter of not less than 2 inches, a high heating efficiency needs to be maintained. The insulating member 2 can maintain a high heating efficiency.

[Configuration of Jig]

Figure 2:
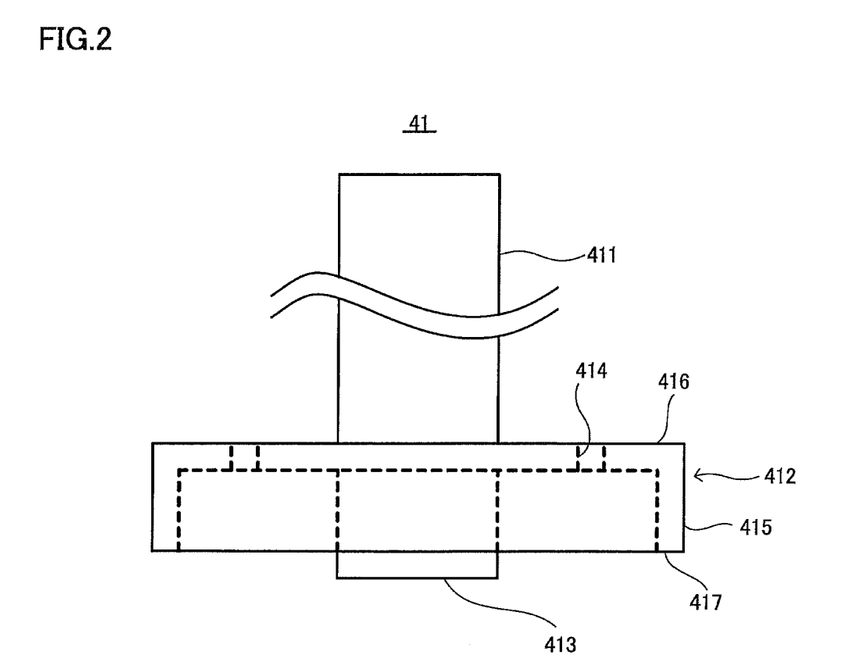
FIG. 2 is a side view of a jig in FIG. 1.
Figure 3:
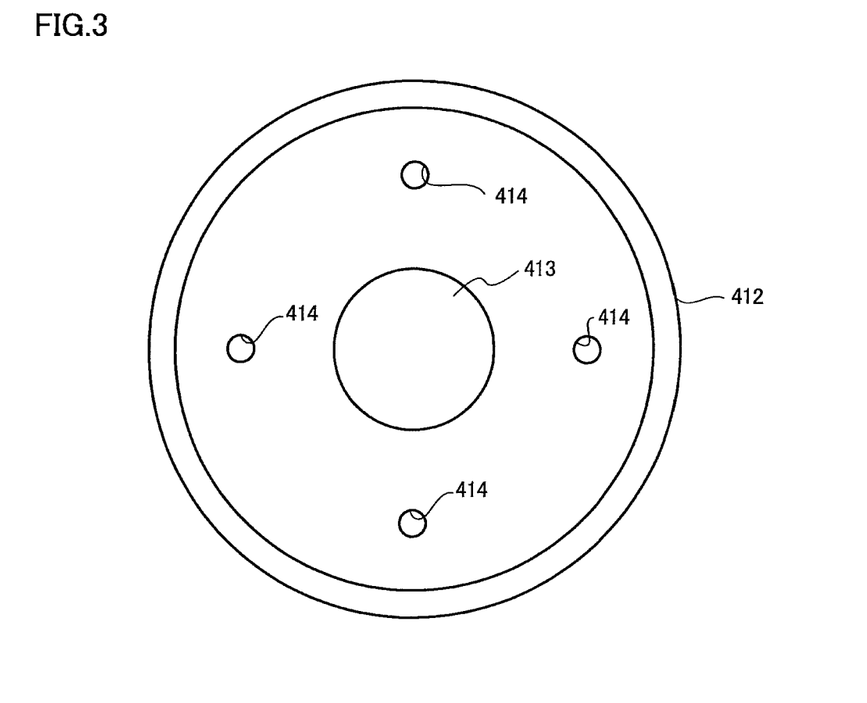
FIG. 3 is a bottom view of a jig shown in FIG. 2.

FIG. 2 is a side view of the jig 41 in FIG. 1. FIG. 3 is a bottom view of the jig 41. Referring to FIGS. 2 and 3, the jig 41 includes a seed shaft 411 and a cover member 412. The seed shaft 411 is bar-shaped and extends in the up-and-down direction of the manufacturing apparatus 100. The seed shaft 411 has a lower end surface 413. A SiC seed crystal 9 is attached to the lower end surface 413.

The raw material of the seed shaft 411 is not specifically limited. The seed shaft 411 is made of, for example, graphite. The seed shaft 411 may be a sintered body of SiC, or a high-melting-point metal.

The cover member 412 is a housing having an open lower end. The cover member 412 can be housed in the crucible 6. As shown in FIG. 1, the lower end 417 of the cover member 412 is brought into contact with a portion near the surface of the SiC solution 8 in the crucible 6. As a result of this, the cover member 412 covers a portion of the SiC solution in the periphery of the SiC seed crystal 9 (SiC seed-crystal peripheral area), thereby forming a substantially closed space. Thereby, the SiC seed-crystal peripheral area is thermally insulated.

Referring to FIGS. 2 and 3 again, the cover member 412 is a tube body having an open lower end, and includes a plate-shaped upper cover portion 416 and a skirt portion 415.

The upper cover portion 416 is disc-shaped and has a through hole in its center. The seed shaft 411 is inserted into the through hole. Therefore, the seed shaft 411 penetrates through the upper cover portion 416. The upper cover portion 416 is fixed to the seed shaft 411. A plurality of vent holes 414 are formed in the upper cover portion 416.

The skirt portion 415 surrounds the lower end portion of the seed shaft 411. In this case, a gap is formed between the inner wall of the skirt portion 415 and the surface of the seed shaft 411. That is, the skirt portion 415 surrounds the lower end portion of the seed shaft 411 leaving a gap therebetween.

The upper end of the skirt portion 415 connects to the outer circumference of the upper cover portion 416. The skirt portion 415 and the upper cover portion 416 may be integrally formed, or may be separate members. In FIGS. 2 and 3, the skirt portion 415 is a cylinder.

The cover member 412 is required to have heat resistance properties as with the seed shaft 411. The raw material of the cover member 412 is, for example, graphite. The raw material of the cover member 412 may be a SiC sintered body or a high-melting-point metal.

[Manufacturing Method of SiC Single Crystal]

A method for manufacturing a SiC single crystal by using the manufacturing apparatus 100 having the above described configuration will be described. In the manufacturing of a SiC single crystal, when the temperature of a SiC seed-crystal peripheral area of a SiC solution in the crucible 6 excessively decreases, a SiC polycrystal spontaneously nucleates and grows in the SiC seed-crystal peripheral area. The SiC polycrystal hinders the growth of the SiC single crystal formed on the SiC seed crystal 9.

In the manufacturing apparatus 100, when a SiC single crystal is manufactured, the cover member 412 covers the SiC seed-crystal peripheral area, thereby forming a closed space as shown in FIG. 1. The cover member 412 causes the radiation heat of the SiC seed-crystal peripheral area to be accumulated in the closed space. Therefore, the closed space is thermally insulated so that temperature decrease in the SiC seed-crystal peripheral area is suppressed. As a result, the generation of SiC polycrystal is suppressed. Hereafter, the method for manufacturing a SiC single crystal according to the present embodiment will be described in detail.

A method for manufacturing a SiC single crystal according to the present embodiment utilizes the above described manufacturing apparatus 100. In the method for manufacturing a SiC single crystal according to the present embodiment, first, the manufacturing apparatus 100 is provided and a SiC seed crystal 9 is attached to the seed shaft 411 (providing step). Next, the crucible 6 is disposed in the chamber 1 to produce the SiC solution 8 (SiC solution production step). Next, the SiC seed crystal 9 is brought into contact with the SiC solution 8 in the crucible 6 (contacting step). Next, the SiC single crystal is grown (growth step). Hereafter, details of each step will be described.

[Providing Step]

First, the manufacturing apparatus 100 including the jig 41 is provided. Then, the SiC seed crystal 9 is attached to the lower end surface 413 of the seed shaft 411.

[SiC Solution Production Step]

Next, the crucible 6 is disposed on the rotating member 51 in the chamber 1. The crucible 6 houses the starting material of SiC solution 8. The crucible 6 is preferably disposed in coaxial with the rotating member 51. In this case, when the rotating member 51 rotates, the temperature of the SiC solution 8 in the crucible 6 is likely to be kept uniform.

Next, the SiC solution 8 is produced. Inert gas is filled into the chamber 1. Then, the starting material of the SiC solution 8 in the crucible 6 is heated to not less than the melting point by a heating unit 3. When the crucible 6 is made up of graphite, heating the crucible 6 causes carbon to dissolve into the melt from the crucible 6, thereby producing the SiC solution 8. As described above, the SiC solution 8 contains Si and C, and may further contain other metal elements. When the carbon of the crucible 6 dissolves into the SiC solution 8, the carbon concentration in the SiC solution 8 reaches a saturation concentration.

[Contacting Step]

Next, the SiC seed crystal 9 is brought into contact with the SiC solution 8. To be specific, the jig 41 is moved down by the driving source 42 to bring the SiC seed crystal 9 into contact with the SiC solution 8. In this occasion, the lower end of the cover member 412 is also brought into contact with the SiC solution 8 as shown in FIG. 1. Thereby, the SiC seed-crystal peripheral area of the SiC solution 8 is covered by the cover member 412 so that a substantially closed space is formed above the SiC seed-crystal peripheral area.

[Growth Step]

After the SiC seed crystal 9 is brought into contact with the SiC solution 8, the SiC solution 8 is held at the crystal growth temperature by the heating unit 3. Further, the SiC seed-crystal peripheral area of the SiC solution 8 is supercooled such that SiC is supersaturated. The method for cooling the SiC seed-crystal peripheral area is as follows.

For example, the heating unit 3 is controlled so as to keep the temperature of the SiC seed-crystal peripheral area to be lower than that of the other portion of the SiC solution 8. Moreover, the SiC seed-crystal peripheral area may be cooled with a coolant. To be specific, a coolant is circulated inside the seed shaft 411. The coolant may be, for example, inert gas such as helium (He) and argon (Ar). Circulating the coolant in the seed shaft 411 will cause the SiC seed crystal 9 to be cooled. Since the SiC seed-crystal peripheral area is located around the SiC seed crystal 9, when the SiC seed crystal 9 is cooled, a portion near the SiC seed crystal 9 will also be cooled. When the SiC seed-crystal peripheral area is brought into a supercooled state by the above described method, the SiC concentration increases and becomes supersaturated.

It can do without circulating a coolant in the seed shaft 411. Even in such a case, the temperature of the seed shaft 411 is lower than that of the SiC solution 8. Therefore, the heat of the SiC solution 8 is dissipated by the seed shaft 411 so that the SiC seed-crystal peripheral area is brought into a supercooled state.

Moreover, the interior of the seed shaft 411 may be hollow. In this case, the temperature of the SiC solution 8 near the seed shaft 411 decreases due to radiation cooling (radiation heat dissipation). Thereby, the SiC seed-crystal peripheral area is brought into a supercooled state.

The SiC seed crystal 9 and the crucible 6 are rotated while SiC in the SiC seed-crystal peripheral area being kept supersaturated. Rotating the seed shaft 411 will cause the SiC seed crystal 9 to rotate. Rotating the rotating member 51 will cause the crucible 6 to rotate. The rotational direction of the SiC seed crystal 9 may be opposite to, or the same as that of the crucible 6. Moreover, the rotational speed may be constant or variable. The seed shaft 411 gradually moves up while rotating. In this occasion, a SiC single crystal is produced and grown on the surface of the SiC seed crystal 9 which is in contact with the SiC solution 8.

Note that the seed shaft 411 may rotate without moving up. Further, the seed shaft 411 may neither rotate nor move up. In such a case, although the growth rate will be reduced, the SiC single crystal will grow.

If the temperature of the SiC seed-crystal peripheral area excessively decreases while a SiC single crystal is growing, a SiC polycrystal spontaneously nucleates. Especially when the seed shaft 411 is made up of graphite, a SiC polycrystal is likely to be generated in the vicinity of the seed shaft 411. Since the seed shaft 411 made up of graphite has a high heat dissipation capability, it is likely to decrease the temperature of the SiC solution 8. On that account, the surface of the seed shaft 411 is likely to become a nucleation site of SiC, and a polycrystal is likely to be generated on the surface of the seed shaft 411. The generated SiC polycrystal hinders the growth of the SiC single crystal which is formed on the surface of the SiC seed crystal 9. The SiC polycrystal is mixed in the SiC single crystal which is being grown.

However, in the present embodiment, the cover member 412 covers the SiC seed-crystal peripheral area. On that account, a closed space is formed above the SiC seed-crystal peripheral area. Since heat released from the surface of the SiC seed-crystal peripheral area is accumulated in the closed space, the SiC seed-crystal peripheral area is thermally insulated by the cover member 412. Therefore, the temperature of the SiC seed-crystal peripheral area is not likely to excessively decrease, and a SiC polycrystal is not likely to be generated during the manufacturing of a SiC single crystal.

Further, the cover member 412 has a plurality of vent holes 414. While a SiC single crystal is being grown, gas is generated from the SiC solution. The generated gas gathers in the closed space formed by the cover member 412. If the pressure of the closed space is excessively increased by gas, the surface of the SiC solution may be pressed down by the gas in the closed space so that the SiC single crystal being grown may be separated from the liquid surface. If the cover member 412 has a vent hole 414, the gas generated from the SiC solution 8 will be released to the outside of the cover member 412 by way of the vent hole 414. On that account, it is possible to suppress increase of the pressure of the closed space. However, it is possible to manufacture a SiC single crystal even without the vent hole 414.

As so far described, the method for manufacturing a SiC according to the present embodiment can suppress the generation of SiC polycrystal by using the jig 41 including the cover member 412. On that account, a SiC polycrystal is not likely to mix in a SiC single crystal which is being grown. Further, since the cover member 412 has vent holes 414, it is possible to suppress excessive increase of the pressure in the closed space.

In the method for manufacturing a SiC single crystal according to the present embodiment, a SiC single crystal is manufactured while the lower end 417 of the cover member 412 is in contact with the SiC solution 8. However, the lower end 417 of the cover member 412 may be separated from the surface of the SiC solution 8. Even in such a case, the SiC seed-crystal peripheral area is thermally insulated to some degree. However, the contact of the lower end 417 of the cover member 412 with the SiC solution 8 will provide better thermal insulation of the SiC seed-crystal peripheral area.

In the above described method for manufacturing a SiC single crystal, since the seed shaft 411 gradually moves up while the SiC single crystal is being grown, the lower end 417 of the cover member 412 also gradually moves up. On that account, the skirt portion 415 preferably has a level of height to keep the lower end 417 thereof to be contacted with the SiC solution 8 until the growth of SiC single crystal ends.

Figure 4:
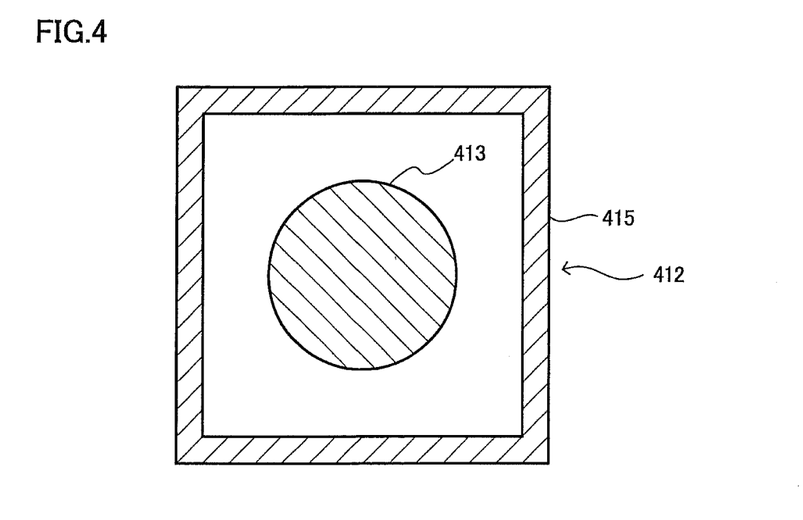
FIG. 4 is a cross-sectional view of a jig having a different shape from that in FIG. 2.
Figure 5:
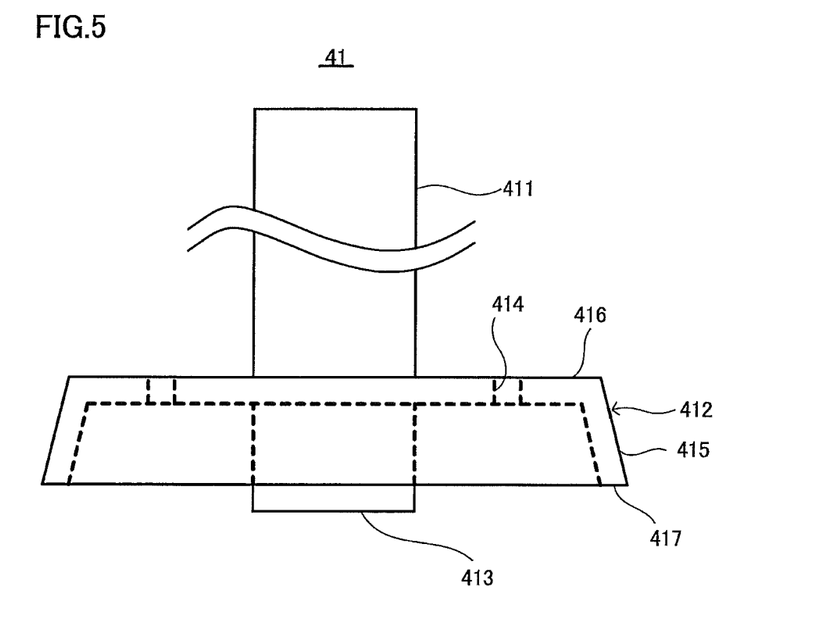
FIG. 5 is a side view of a jig different from that in FIG. 2.

In the above described embodiment, the cover member 412 has a cylindrical shape having an opening at the lower end 417. However, the shape of the cover member 412 will not limited to this shape. For example, the skirt portion 415 of the cover member 412 may be a tube having a cross section (section in the horizontal direction) of rectangular and polygonal shapes as shown in FIG. 4. Moreover, the longitudinal section (section in the vertical direction) of the cover member 412 may have a triangular shape, or may have a trapezoidal shape and a bell shape as shown in FIG. 5. The shape of the cover member 412 will not be particularly limited, provided that it is a housing which has a space inside and an opening at the lower end.

In FIG. 2, the lower end surface 413 of the seed shaft 411 is disposed lower than the lower end 417 of the cover member 412. However, the lower end surface 413 of the seed shaft 411 may be disposed higher than the lower end 417 of the cover member 412. That is, the lower end surface 413 may be housed in the cover member 412.

Moreover, in FIGS. 2 and 3, the skirt portion 415 surrounds the entire circumference of the lower end portion of the seed shaft 411. However, it may also be such that the skirt portion 415 does not surround the entire circumference of the lower end portion of the seed shaft 411.

As shown in FIG. 3, when the cross section of the cover member 412 is circular-shaped, the differential value D1 between the inner diameter of the cover member 412 and the outer diameter of the seed shaft 411 is preferably 10 mm to 20 mm. Further, the differential value D2 between the inner diameter of the crucible 6 and the outer diameter of the cover member 412 is preferably 10 mm to 20 mm. When both of the differential values D1 and D2 satisfy the above described numerical range, since solution is not likely to enter into the gap, the SiC single crystal can be grown more stably. However, even if the differential values D1 and D2 deviate from the above described range, it is possible to grow SIC single crystal stably to some extent.

Moreover, the distance H1 between the lower surface of the upper cover portion 416 of the cover member 412 and the surface of the SiC solution 8 (see FIG. 1) during the growth of SiC single crystal is preferably not more than 20 mm. In this case, the SiC seed-crystal peripheral part is thermally insulated more effectively. However, even if the distance H1 exceeds 20 mm, the cover member 412 thermally insulates the SiC seed-crystal peripheral area to some degree.

Second Embodiment

In the first embodiment, the cover member 412 is fixed to the seed shaft 411. However, the cover member 412 may not be fixed to the seed shaft 411. That is, the seed shaft 411 may be disposed separated from the cover member 412 and be rotatable with respect to the cover member 412.

Figure 6:
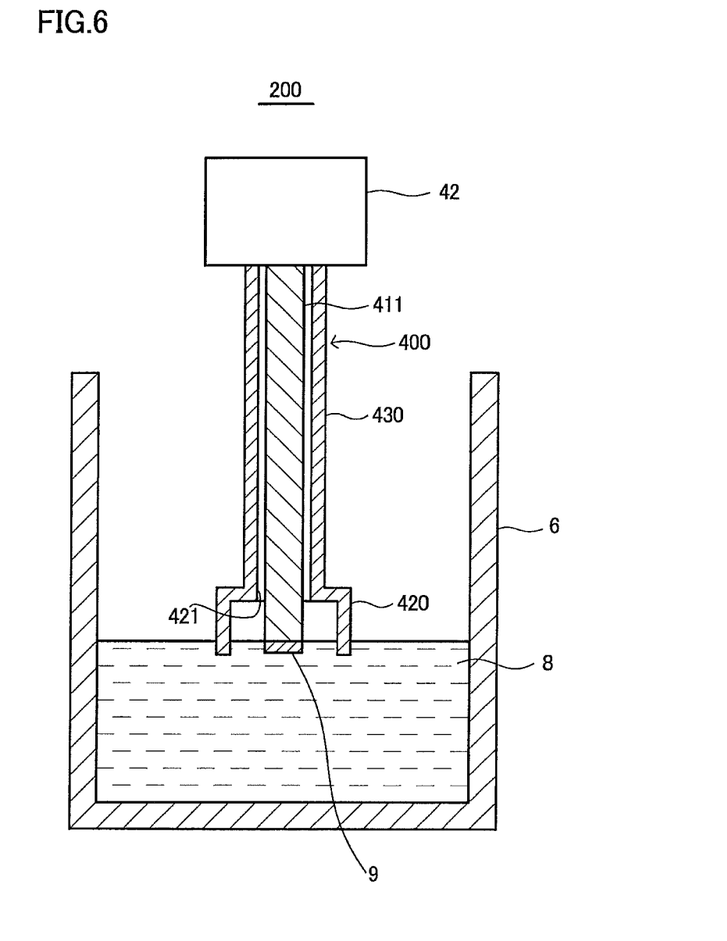
FIG. 6 is a schematic diagram of a manufacturing apparatus of a SiC single crystal according to a second embodiment.

FIG. 6 is a diagram showing a peripheral portion of a jig of a manufacturing apparatus 200 of a SiC single crystal according to a second embodiment. Referring to FIG. 6, the manufacturing apparatus 200 includes a new jig 400 in place of the jig 41 when compared with the manufacturing apparatus 100. Other configurations of the manufacturing apparatus 200 are the same as those of the manufacturing apparatus 100.

Referring to FIG. 6, the jig 400 includes a seed shaft 411, a cover member 420, and a fixing member 430.

The fixing member 430 is tube-shaped. The seed shaft 411 is inserted inside the fixing member 430. A gap is formed between the inner peripheral surface of the fixing member 430 and the outer peripheral surface of the seed shaft 411. The upper end portion of the fixing member 430 is connected to a driving source 42. The lower end of the fixing member 430 is attached to the upper surface of the cover member 420. The fixing member 430 is moved up and down by the driving source 42. The fixing member 430 and the seed shaft 411 can move up and down independently from each other.

The cover member 420 is a housing having an open lower end. A through hole 421 for passing the seed shaft 411 therethrough is formed in the upper cover portion of the cover member 420. The through hole 421 is larger than the outer diameter of the seed shaft 411. Therefore, the seed shaft 411 is rotatable around the axis of its own with respect to the cover member 420.

The lower end of the fixing member 430 is connected to the upper surface of the cover member 420. Therefore, the cover member 420 is not fixed to the seed shaft 411 but fixed to the manufacturing apparatus 200 by the fixing member 430. When the fixing member 430 moves up and down, the cover member 420 will move up and down as well. The cover member 420 and the fixing member 430 may be integrally formed.

The cover member 420 is fixed to the manufacturing apparatus 200 separately from the seed shaft 411 by the fixing member 430. Therefore, when the seed shaft 411 moves up while rotating during the manufacturing of a SiC single crystal, the cover member 420 will not move up along with the seed shaft 411, but will be fixed at a predetermined position.

A method for manufacturing a SiC single crystal by using the manufacturing apparatus 200 is as follows. The preparation step and the SiC solution production step are the same as those in the first embodiment. In the contacting step, the seed shaft 411 is moved down by the driving source 42 to bring the SiC seed crystal 9 into contact with the SiC solution 8. Next, the fixing member 430 is moved down by the driving source 42 to bring the lower end of the cover member 420 into contact with the SiC solution 8. After the lower end of the cover member 420 is brought into contact with the SiC solution 8, the downward movement of the fixing member 430 is stopped. At this moment, the cover member 420 is fixed at a predetermined position (a position where the lower end of the cover member 420 comes to be in contact with the SiC solution 8).

Next, the growth step is carried out. In the growth step, the seed shaft 411 is moved up while being rotated to grow a SiC single crystal on the SiC seed crystal 9. At this moment, the fixing member 430 does not move up and down. On that account, although the seed shaft 411 moves up, the cover member 420 remains to be fixed at a predetermined position and does not move.

In this case, the cover member 420 is fixed in the growth step. On that account, it is possible to hold the lower end of the cover member 420 being in contact with the SiC solution 8 during the growth of SiC single crystal. Moreover, designing the height of the cover member 420 taking into account the upward moving distance of the seed shaft 411 during the growth step as in the first embodiment is not necessary.

Figure 7:
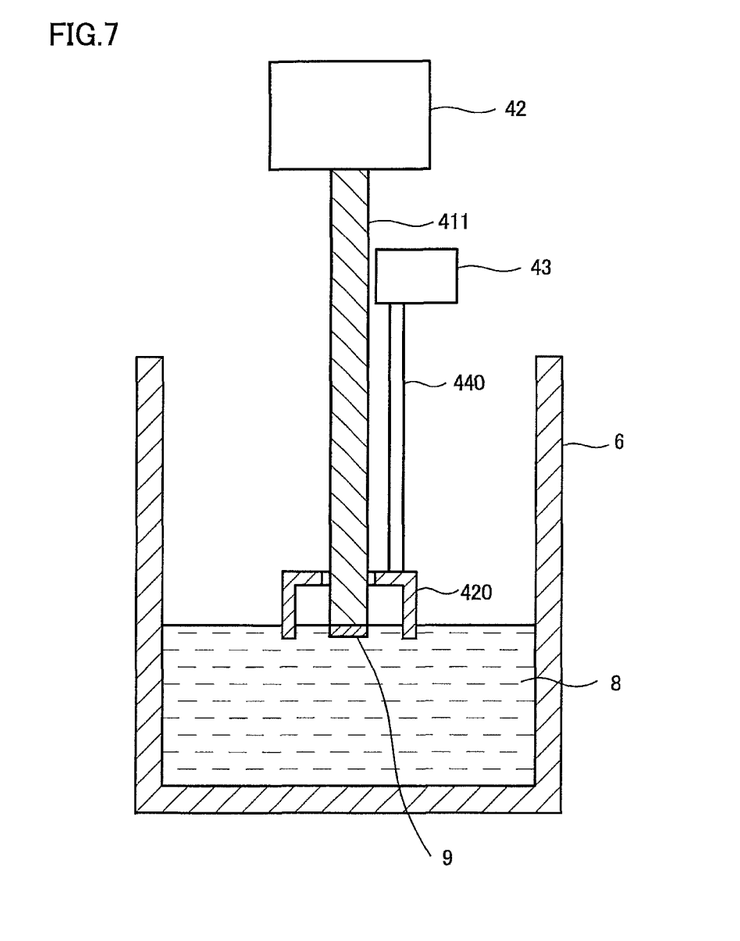
FIG. 7 is a schematic diagram of a manufacturing apparatus of a SiC single crystal, having a configuration different from that in FIG. 6.
Figure 8:
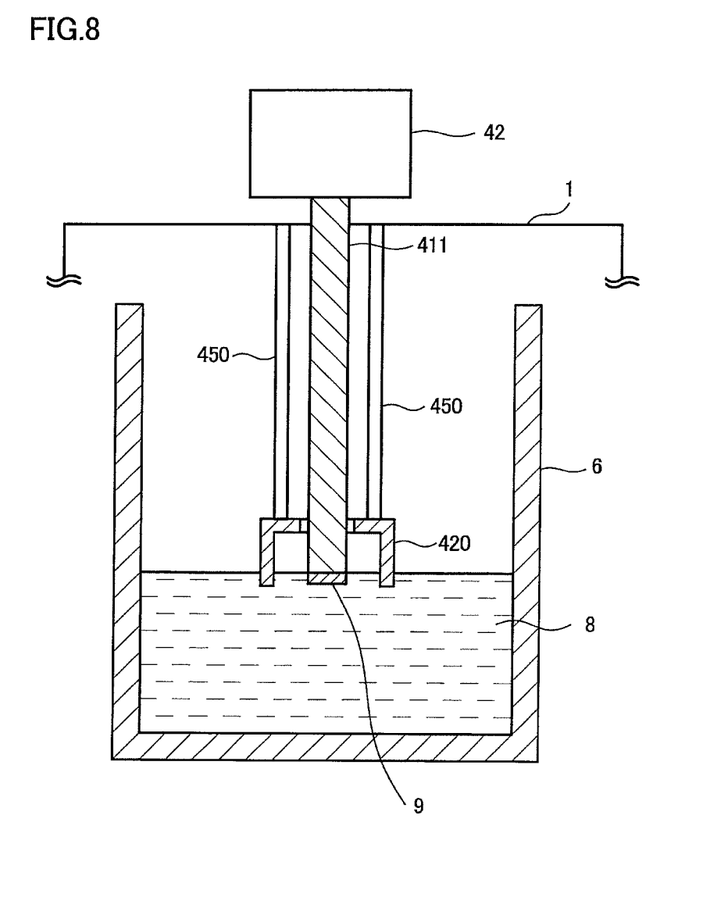
FIG. 8 is a schematic diagram of a manufacturing apparatus of a SiC single crystal, having a configuration different from those of FIGS. 6 and 7.

In the above described embodiment, the fixing member 430 is a tube body which can be moved up and down by the driving source 42. However, the fixing member 430 is not limited to a tube body. The fixing member 430 may have a shape other than the tube body, which is movable up and down. For example, as shown in FIG. 7, the fixing member 440 may be bar-shaped and may be moved up and down by another driving source 43 which is different from the driving source 42. Moreover, as shown in FIG. 8, the upper end of the fixing member 450 may be fixed to the upper surface of the chamber 1, and the lower end of the fixing member 450 may be fixed to the upper surface of the cover member 420 so that the fixing member 450 fixes the cover member 420 at a predetermined position.

Moreover, a member having a high heat reflectivity may be disposed on the inner surfaces of the cover members 412 and 420. In this case, the thermal insulation function of the cover member 412 will be improved.

EXAMPLES

SiC single crystals were manufactured by a solution growth method by using various manufacturing apparatuses. After the manufacturing, the generated amount of SiC polycrystal was investigated.

Inventive Example 1 of the Present Invention

In Inventive Example 1, a manufacturing apparatus having the same configuration as that in FIGS. 1 to 3 was utilized to manufacture a SiC single crystal.

A crucible made up of high purity graphite was provided. The crucible was a cylinder having an open upper end, and having an inner diameter of 80 mm and a height of 150 mm. High purity Si and high purity Ti were housed in the crucible as the starting material of the SiC solution. The molar ratio between Si and Ti in the starting material was Si:Ti=0.77:0.23.

Moreover, a SiC seed crystal made up of 4H crystal polymorphism was attached to the lower end surface of the jig. The SiC seed crystal was a square plate of 25 mm×25 mm, and its surface (that is, the lower surface of the SiC seed crystal when attached to the lower end surface of the seed shaft) was a (0001) plane.

The crucible housing the starting material was accommodated in a water-cooled chamber made of stainless steel. After accommodation, inert gas was filled in the chamber. Next, the starting material in the crucible was inductively heated by a heating unit made up of a high-frequency coil to be held at 1900° C. for 2 hours. By the above described steps, the starting material in the crucible was melted to produce a SiC solution.

Next, the temperature of the SiC solution was adjusted. To be specific, the temperature of a portion corresponding to the SiC seed-crystal peripheral area of a portion near the surface of the SiC solution was adjusted so as to be lower than that of the other portion by the heating unit. To be specific, the temperature of the SiC solution was adjusted such that a temperature gradient of 10° C./cm was formed from the surface of the SiC seed-crystal peripheral area toward the other portion.

Next, the jig was moved down to bring the SiC seed crystal into contact with the SiC solution. At this moment, the lower end of the cover member was brought into contact with the SiC solution as well. On that account, a closed space was formed above the SiC seed-crystal peripheral area.

Next, a SiC single crystal was grown. The growth time was 5 hours. During the growth, the crucible and the jig were rotated in mutually opposite directions. During the growth, the lower end of the cover member of the jig was constantly in contact with the SiC solution.

After the growth, the seed shaft was moved up and the SiC seed crystal was taken out of the chamber. Then, the SiC seed crystal was washed with a liquid mixture containing nitric acid and fluonitric acid to remove the condensate of the SiC solution adhering to the SiC seed crystal.

The (0001) surface of the SiC seed crystal was observed by means of an optical microscope having a magnification of 100 times. Further, Raman spectroscopy was performed on the surface thereof at a pitch of 1 mm for each of longitudinal and lateral directions.

According to the result of Raman spectroscopy, a SiC single crystal of 4H crystal polymorphism was formed on the surface of the SiC seed crystal. The SiC seed crystal was cut in the longitudinal direction to investigate the thickness of the produced SiC single crystal. As a result, the thickness of the SiC single crystal was 1 mm.

Some SiC polycrystals were further formed on the surface of the SiC seed crystal. Accordingly, the generated amount of SiC polycrystal was measured. To be specific, the SiC polycrystal was determined by the observation with an optical microscope having a magnification of 100 times. The SiC polycrystal includes a plurality of crystal grains having different orientations. On that account, the SiC polycrystal has much unevenness, and can be easily distinguished from a SiC single crystal. A total area of the SiC polycrystal determined on the surface of the SiC seed crystal was measured. Further, the portion of the surface of the SiC seed crystal, where each SiC polycrystal was generated, was cut in the longitudinal direction to measure the thickness of the SiC polycrystal. An average of the obtained thicknesses of the SiC polycrystal was determined. A value obtained by multiplying the determined average thickness by the total area was defined as a total volume of the SiC polycrystal.

Inventive Example 2 of the Present Invention

In Inventive Example 2, a manufacturing apparatus different from that in Inventive Example 1 was used. To be specific, although the cover member of the jig had four vent holes in Inventive Example 1, the cover member of Inventive Example 2 had no vent hole. Other configurations of Inventive Example 2 were the same as those of Inventive Example 1.

A SiC single crystal was manufactured at the same manufacturing condition as that of Inventive Example 1. After manufacturing, the total volume of the generated SiC polycrystal was determined by the same method as that in Inventive Example 1.

Comparative Example

In Comparative Example, a manufacturing apparatus different from that in Inventive Example 1 was used. To be specific, the manufacturing apparatus of Comparative Example did not have a cover member. Other configurations of the manufacturing apparatus of Comparative Example were the same as those of Inventive Example 1.

A SiC single crystal was manufactured at the same manufacturing condition as that of Inventive Example 1. After manufacturing, the total volume of the produced SiC polycrystal was determined by the same method as that in Inventive Example 1.

[Result of the Investigation]

The total volume of SiC polycrystal of Comparative Example was 8.4 cc. On the other hand, the total volume of SiC polycrystal of Inventive Example 1 was 2.8 cc, and the total volume of SiC polycrystal of Inventive Example 2 was 2.1 cc. Therefore, the generated amount of SiC polycrystal in Inventive Examples 1 and 2 were remarkably less than that in Comparative Example.

Although embodiments of the present invention have been described so far, the above described embodiments are merely exemplification for carrying out the present invention. Therefore, the present invention will not be limited to the embodiments described above, and the above described embodiments can be appropriately modified and carried out within a range not departing from the spirit of the present invention.

The invention claimed is:

1. A manufacturing apparatus of a SiC single crystal, comprising:
   a chamber capable of accommodating a crucible for housing a SiC solution;
   a vertical seed shaft which has a lower end surface to which a SiC seed crystal can be attached; and
   a cover member which is a housing having an open lower end and can be housed in the crucible, wherein a lower end portion of the seed shaft is disposed inside the cover member, the cover member having a vent hole.

2. The manufacturing apparatus according to claim 1, wherein
   the cover member comprises:
   a skirt portion which surrounds the lower end portion of the seed shaft leaving a gap therebetween; and
   an upper cover portion through which the seed shaft penetrates and which is connected to an upper end of the skirt portion.

3. The manufacturing apparatus according to claim 1, wherein
   the cover member is fixed to the seed shaft.

4. The manufacturing apparatus according to claim 1, further comprising:
   a fixing member fixing the cover member at a predetermined position in the chamber; wherein
   the seed shaft is rotatable around an axis of the seed shaft with respect to the cover member.

5. The manufacturing apparatus according to claim 4, wherein
   the fixing member can move up and down in the up-and-down direction of the manufacturing apparatus.

6. The manufacturing apparatus according to claim 1, wherein
   the lower end of the cover member is to be brought into contact with the SiC solution in the crucible.

7. A jig for use in a manufacturing apparatus of a SiC single crystal by a solution growth method, the jig comprising:
   a bar-shaped seed shaft having a lower end surface to which a SiC seed crystal is to be attached; and a cover member which is a housing having an open lower end, wherein the lower end portion of the seed shaft is disposed inside the cover member, the cover member having a vent hole.

8. The jig according to claim 7, wherein
the cover member comprises:
a skirt portion which surrounds the lower end portion of the seed shaft leaving a gap therebetween; and
an upper cover portion through which the seed shaft penetrates and which is connected to an upper end of the skirt portion.

9. The jig according to claim 7, wherein
the cover member is fixed to the seed shaft.

10. The jig according to claim 7, wherein
the seed shaft is rotatable around an axis of the seed shaft with respect to the cover member.

11. A method for manufacturing a SiC single crystal by a solution growth method, comprising the steps of:

providing a jig including a vertical seed shaft which has a lower end surface, and a cover member which is a housing having an open lower end and inside which a lower end portion of the seed shaft is disposed, the cover member having a vent hole;

attaching a SiC seed crystal to the lower end surface of the seed shaft;

heating a crucible which houses a starting material containing Si to produce a SiC solution;

bringing the SiC seed crystal attached to the jig into contact with the SiC solution in the crucible; and growing the SiC single crystal on the SiC seed crystal.

12. The method for manufacturing the SiC single crystal according to claim 11, wherein
the step of growing the SiC single crystal further includes immersing a lower end of the cover member in the SiC solution in the crucible.

* * * * *